United States Patent
Chen et al.

(10) Patent No.: US 8,665,250 B2
(45) Date of Patent: Mar. 4, 2014

(54) SHIFT REGISTER CIRCUIT

(75) Inventors: Kuan-Yu Chen, Hsin-Chu (TW); Wei-Cheng Lin, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 403 days.

(21) Appl. No.: 13/051,601

(22) Filed: Mar. 18, 2011

(65) Prior Publication Data

US 2012/0038603 A1 Feb. 16, 2012

(30) Foreign Application Priority Data

Aug. 10, 2010 (TW) .............................. 99126646 A
Sep. 9, 2010 (TW) .............................. 99130555 A

(51) Int. Cl.
*G06F 3/038* (2013.01)

(52) U.S. Cl.
USPC ................ 345/204; 345/94; 345/99; 345/211

(58) Field of Classification Search
USPC ......... 345/98–100, 53, 87, 94, 173–184, 204, 345/208, 211
See application file for complete search history.

(56) References Cited

U.S. PATENT DOCUMENTS

| 8,223,109 B2 | 7/2012 | Chang et al. |
| 2007/0146289 A1* | 6/2007 | Lee et al. ................... 345/100 |
| 2008/0088564 A1 | 4/2008 | Chang et al. |
| 2008/0284698 A1* | 11/2008 | Lee et al. ..................... 345/87 |
| 2010/0134234 A1 | 6/2010 | Liao et al. |

FOREIGN PATENT DOCUMENTS

| TW | 201015522 A | 4/2010 |
| TW | 201023149 A1 | 6/2010 |

OTHER PUBLICATIONS

Taiwan Patent Office, Office Action issued on May 3, 2013.

* cited by examiner

*Primary Examiner* — Lun-Yi Lao
*Assistant Examiner* — Insa Sadio
(74) *Attorney, Agent, or Firm* — WPAT, PC; Justin King

(57) ABSTRACT

A shift register circuit includes plural stages of shift registers. Each stage of shift register includes a pull-up circuit, a control signal generator and a voltage-stabilizing circuit. The pull-up circuit is used for charging a first node. The control signal generator is electrically connected with the first node. According to a voltage level of the first node, a corresponding control signal is outputted from an output terminal of the control signal generator. The voltage-stabilizing circuit is electrically connected with the output terminal of the control signal generator for stabilizing the control signal from the control signal generator. Some circuits of some other shift registers are controlled according to the control signal.

15 Claims, 7 Drawing Sheets

SHIFT REGISTER CIRCUIT

FIELD OF THE INVENTION

The present invention relates to a display technology, and more particularly to a shift register circuit.

BACKGROUND OF THE INVENTION

Conventionally, a shift register circuit used in a flat panel display (e.g. a liquid crystal display) comprises plural cascade-connected stages of shift registers for successively generating plural driving pulse signals. For example, the shift registers are used to successively generate gate driving pulse signals for driving the gate lines of the liquid crystal display. In addition, each stage of shift register is used to generate a corresponding start pulse signal. The start pulse signal is transmitted to a next-stage shift register to enable the next-stage shift register.

Moreover, the driving pulse signal generated by each stage of shift register or the voltage signal resulted from a node between the pull-up circuit and the driving circuit of each stage of shift register can also be used as a control signal. The control signal can be used to control some circuits (e.g. discharging circuit) of other stages of shift registers. However, since these signals are used for driving a great number of electronic components, the loading is very heavy. For example, in a case that the gate driving pulse signals are used to drive a great number of thin film transistors of a corresponding gate line, the RC delay effect becomes more serious, and thus the waveforms thereof are seriously distorted. In other words, when these signals are used as the control signals, the normal operations of the shift register circuit and the flat panel display are adversely affected because the reliability thereof is impaired.

SUMMARY OF THE INVENTION

Therefore, the present invention provides a shift register circuit with high reliability.

In accordance with an aspect, the present invention provides a shift register circuit. The shift register circuit includes plural stages of shift registers. Each stage of shift register includes a pull-up circuit, a control signal generator and a voltage-stabilizing circuit. The pull-up circuit is used for charging a first node. The control signal generator is electrically connected with the first node. According to a voltage level of the first node, a corresponding control signal is outputted from an output terminal of the control signal generator. The voltage-stabilizing circuit is electrically connected with the output terminal of the control signal generator for stabilizing the control signal from the control signal generator. Some circuits of some other shift registers are controlled according to the control signal.

In an embodiment, each stage of shift register includes a first driving circuit and a second driving circuit. The first driving circuit is electrically connected with the first node. According to the voltage level of the first node, a corresponding start pulse signal is outputted from an output terminal of the first driving circuit. The second driving circuit is electrically connected with the first node. According to the voltage level of the first node, a corresponding driving pulse signal is outputted from an output terminal of the second driving circuit.

In an embodiment, the voltage-stabilizing circuit includes a voltage-stabilizing control unit, a first voltage-stabilizing unit and a second voltage-stabilizing unit. The voltage-stabilizing control unit is used for generating a voltage-stabilizing control signal corresponding to the current-stage shift register. The first voltage-stabilizing unit is electrically connected with the voltage-stabilizing control unit for receiving the voltage-stabilizing control signal. According to the voltage-stabilizing control signal, the first voltage-stabilizing unit determines whether the output terminal of the control signal generator is discharged. The second voltage-stabilizing unit is used for receiving a previous-stage voltage-stabilizing control signal from a previous voltage-stabilizing control unit of a previous-stage shift register. According to the previous-stage voltage-stabilizing control signal, the second voltage-stabilizing unit determines whether the output terminal of the control signal generator is discharged.

In the shift register circuit of the present invention, each stage of shift register of the shift register circuit has an exclusive control signal generator to generate a corresponding control signal. The control signal is only used as the control signal of some circuits of other stages of shift registers. Since it is not necessary to drive heavy loading, the problems of causing seriously distorted waveforms will be eliminated. Under this circumstance, the overall shift register circuit and the flat panel display can be normally operated.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
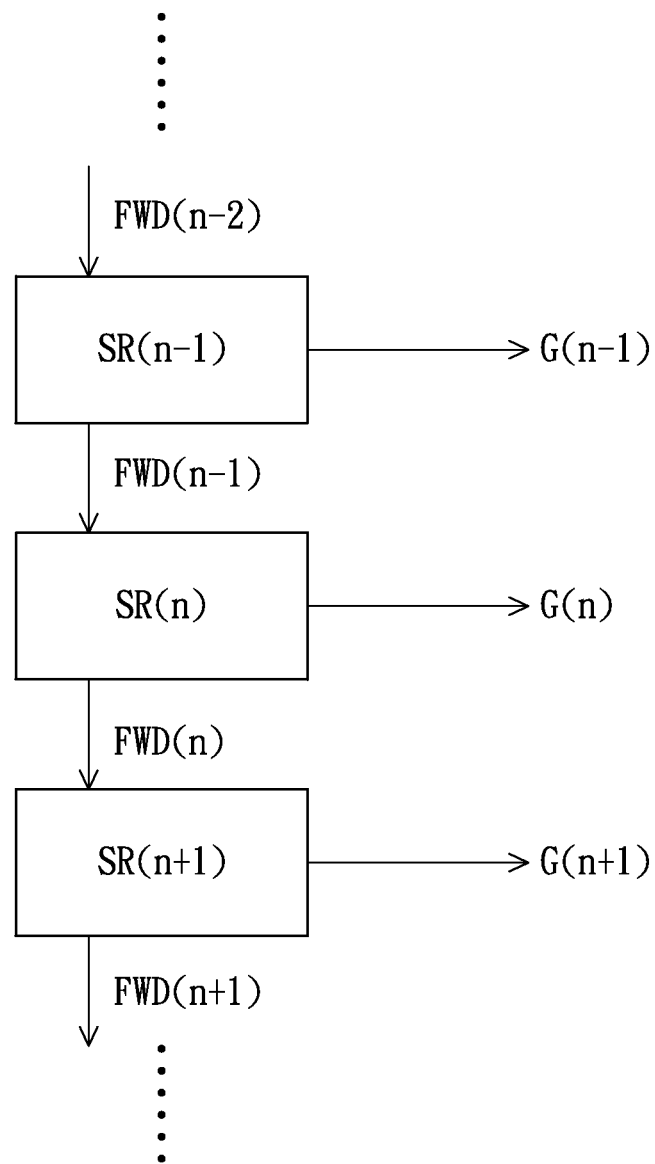
FIG. 1 is a schematic functional block diagram illustrating a portion of a shift register circuit according to an embodiment of the present invention.

FIG. 1 is a schematic functional block diagram illustrating a portion of a shift register circuit according to an embodiment of the present invention. In this embodiment, the shift register circuit 100 is applied to a gate driving circuit of a liquid crystal display for successively driving the gate lines of the liquid crystal display. It is noted that the applications of the shift register circuit 100 are not limited to a gate driving circuit of a liquid crystal display. For example, the shift register circuit 100 may also be applied to a source driving circuit of a liquid crystal display. As shown in FIG. 1, the shift register circuit 100 comprises plural cascade-connected stages of shift registers such as SR(n−1), SR(n) and SR(n+1). The shift registers SR(n−1), SR(n) and SR(n+1) are used for successively generating corresponding gate driving pulse signals G(n−1), G(n) and G(n+1), and generating corresponding start pulse signals FWD(n−1), FWD(n) and FWD(n+1). The start pulse signal generated by each stage of shift register is transmitted to a next-stage shift register so as to enable the next-stage shift register.

Figure 2:
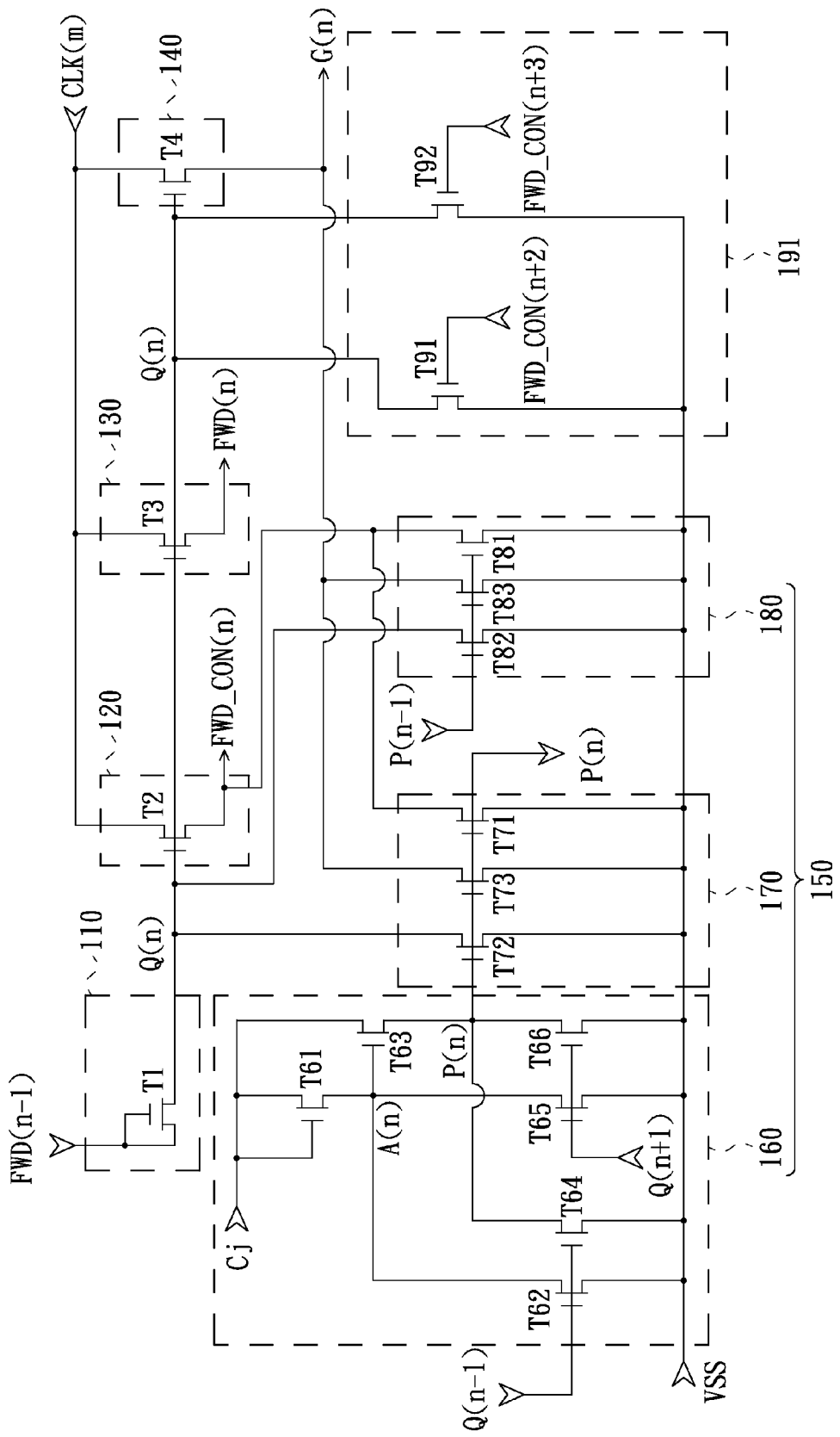
FIG. 2 is a schematic circuit diagram illustrating a shift register according to a first embodiment of the present invention.

FIG. 2 is a schematic circuit diagram illustrating a shift register according to a first embodiment of the present invention. In FIG. 2, the detailed configurations of the shift register SR(n) of FIG. 1 are shown for illustration. In particular, the shift register SR(n) comprises a pull-up circuit 110, a control signal generator 120, a first driving circuit 130, a second driving circuit 140, a voltage-stabilizing circuit 150 and a first discharging circuit 191. The control signal generator 120, the first driving circuit 130 and the second driving circuit 140 are connected with each other in parallel. The pull-up circuit 110 is electrically connected with the control signal generator 120, the first driving circuit 130 and the second driving circuit 140 at a first node Q(n).

The pull-up circuit 110 is used for charging the first node Q(n). According to the voltage level of the first node Q(n), a control signal FWD CON(n) is outputted from the output terminal of the control signal generator 120. Similarly, according to the voltage level of the first node Q(n), a corresponding start pulse signal FWD(n) is outputted from the output terminal of the first driving circuit 130. Similarly, according to the voltage level of the first node Q(n), a corresponding driving pulse signal G(n) is outputted from the output terminal of the second driving circuit 140. In addition, the voltage-stabilizing circuit 150 is electrically connected with the output terminal of the control signal generator 120 to stabilizing the control signal FWD CON(n) from the control signal generator 120. Of course, the voltage-stabilizing circuit 150 may be further electrically connected with the first node Q(n) and/or the output terminal of the second driving circuit 140, thereby stabilizing the voltage level of the first node Q(n) and/or the driving pulse signal G(n) from the second driving circuit 140. The first discharging circuit 191 is electrically connected with the first node Q(n) for discharging the first node Q(n).

Hereinafter, the shift register will be illustrated by referring to plural transistors. It is noted that, however, those skilled in the art will readily observe that numerous modifications and alterations may be made while retaining the teachings of the invention. For example, the transistors may be replaced other switches. The control terminals of the switches are equivalent to the gates of the transistors; and the conduction terminals at both ends of each switch are equivalent to the source and drain of the transistor.

The pull-up circuit 110 comprises a transistor T1 (e.g. a pull-up transistor). The previous start pulse signal FWD(n−1) outputted from the previous-stage shift register SR(n−1) is received by the gate of the transistor T1. The previous start pulse signal FWD(n−1) is also received by the source of the transistor T1. The drain of the transistor T1 is used as the output terminal of the pull-up circuit 110 to be electrically connected the first node Q(n).

The control signal generator 120 comprises a transistor T2. The gate of the transistor T2 is electrically connected with the first node Q(n). A corresponding clock-pulse signal CLK(m) is received by the source of the transistor T2. The drain of the transistor T2 is used as the output terminal of the control signal generator 120 to output a corresponding control signal FWD CON(n).

The first driving circuit 130 comprises a transistor T3 (i.e. a first driving transistor). The gate (i.e. a first driving control terminal) of the transistor T3 is electrically connected with the first node Q(n). The clock-pulse signal CLK(m) is also received by the source (i.e. a first driving conduction terminal) of the transistor T3. The drain (i.e. a second driving conduction terminal) of the transistor T3 is used as the output terminal of the first driving circuit 130 to output a corresponding start pulse signal FWD(n).

The second driving circuit 140 comprises a transistor T4 (i.e. a second driving transistor). The gate (i.e. a second driving control terminal) of the transistor T4 is electrically connected with the first node Q(n). The clock-pulse signal CLK (m) is also received by the source (i.e. a third driving conduction terminal) of the transistor T4. The drain (i.e. a fourth driving conduction terminal) of the transistor T4 is used as the output terminal of the second driving circuit 140 to output a corresponding driving pulse signal G(n).

In addition, the voltage-stabilizing circuit 150 comprises a voltage-stabilizing control unit 160, a first voltage-stabilizing unit 170 and a second voltage-stabilizing unit 180. When plural control signals are received by the voltage-stabilizing control unit 160, corresponding voltage-stabilizing control signals of the current-stage shift register SR(n) are outputted from the output terminal P(n) of the voltage-stabilizing control unit 160. The first voltage-stabilizing unit 170 is electrically connected with the output terminal P(n) of the voltage-stabilizing control unit 160 for receiving the voltage-stabilizing control signals. Moreover, according to the voltage-stabilizing control signals, the first voltage-stabilizing unit 170 will determine whether the output terminal of the control signal generator 120, the first node Q(n) and/or the output terminal of the second driving circuit 140 is discharged or not. The second voltage-stabilizing unit 180 is electrically connected with the output terminal (n−1) of the voltage-stabilizing control unit of the previous-stage shift register SR(n−1) for receiving the previous voltage-stabilizing control signal. Moreover, according to the previous voltage-stabilizing control signal, the second voltage-stabilizing unit 180 will determine whether the output terminal of the control signal generator 120, the first node Q(n) and/or the output terminal of the second driving circuit 140 is discharged or not.

In this embodiment, the voltage-stabilizing control unit 160 comprises plural transistors T61, T62, T63, T64, T65 and T66. The gate of the transistor T61 receives one of a first reference signal and a second reference signal (Cj). The source of the transistor T61 also receives one of the first reference signal and the second reference signal (Cj). The drain of the transistor T61 is electrically connected with a drain of the transistor T62 at a second node A(n). The gate of the transistor T62 receives a first control signal, for example the voltage level of the previous-stage first node Q(n−1) of the previous-stage shift register SR(n−1). The source of the transistor T62 is electrically connected with a low reference voltage VSS. The gate of the transistor T63 is electrically connected with the second node A(n). The source of the transistor T63 receives one of the first reference signal and the second reference signal (Cj). The drain of the transistor T63 is electrically connected with the drain of the transistor T64 at the output terminal of the voltage-stabilizing control unit 160, so that corresponding voltage-stabilizing control signals of the current-stage shift register SR(n). The gate of the transistor T64 also receives the first control signal. The source of the transistor T64 is electrically connected with a low reference voltage VSS. The gate of the transistor T65 receives a second control signal, for example the voltage level of the next-stage first node Q(n+1) of the next-stage shift register SR(n+1). The source of the transistor T65 is electrically connected with the low reference voltage VSS. The drain of the transistor T65 is also electrically connected with the second node A(n). The gate of the transistor T66 also receives the second control signal. The source of the transistor T66 is also electrically connected with the low reference voltage VSS. The drain of the transistor T66 is also electrically connected with the output terminal P(n) of the voltage-stabilizing control unit 160.

The first voltage-stabilizing unit 170 comprises plural transistors T71, T72 and T73. The gate of the transistor T71 is electrically connected with the output terminal P(n) of the voltage-stabilizing control unit 160. The source of the transistor T71 is electrically connected with the low reference voltage VSS. The drain of the transistor T71 is electrically connected with the output terminal of the control signal generator 120. The gate of the transistor T72 is also electrically connected with the output terminal P(n) of the voltage-stabilizing control unit 160. The source of the transistor T72 is electrically connected with the low reference voltage VSS. The drain of the transistor T72 is electrically connected with the first node Q(n). The gate of the transistor T73 is also electrically connected with the output terminal P(n) of the voltage-stabilizing control unit 160. The source of the transistor T73 is also electrically connected with the low reference voltage VSS. The drain of the transistor T73 is electrically connected with the output terminal of the second driving circuit 140. That is, according to the voltage-stabilizing control signals outputted from the output terminal P(n) of the voltage-stabilizing control unit 160, the transistors T71, T72 and T73 of the first voltage-stabilizing unit 170 will respectively determine whether the output terminal of the control signal generator 120, the first node Q(n) or the output terminal of the second driving circuit 140 is discharged or not.

The second voltage-stabilizing unit 180 comprises plural transistors T81, T82 and T83. The gate of the transistor T81 is electrically connected with the output terminal P(n−1) of the previous-stage voltage-stabilizing control unit of the previous-stage shift register SR(n−1). The source of the transistor T81 is electrically connected with the low reference voltage VSS. The drain of the transistor T81 is electrically connected with the output terminal of the control signal generator 120. The gate of the transistor T82 is also electrically connected with the output terminal P(n−1) of the previous-stage voltage-stabilizing control unit. The source of the transistor T82 is electrically connected with the low reference voltage VSS. The drain of the transistor T82 is electrically connected with the first node Q(n). The gate of the transistor T83 is also electrically connected with the output terminal P(n−1) of the previous-stage voltage-stabilizing control unit. The source of the transistor T83 is electrically connected with the low reference voltage VSS. The drain of the transistor T83 is electrically connected with the output terminal of the second driving circuit 140. That is, according to the previous-stage voltage-stabilizing control signals outputted from the output terminal P(n−1) of the previous-stage voltage-stabilizing control unit, the transistors T81, T82 and T83 of the second voltage-stabilizing unit 180 will respectively determine whether the output terminal of the control signal generator 120, the first node Q(n) or the output terminal of the second driving circuit 140 is discharged or not.

It is noted that the voltage-stabilizing control unit of the previous-stage shift register SR(n−1) receives the other one of the first reference signal and the second reference signal. The first reference signal and the second reference signal are both low-frequency signals and complementary to each other.

The first discharging circuit 191 is electrically connected between the first node Q(n) and the low reference voltage VSS for discharging the first node Q(n). The first discharging circuit 191 comprises a transistor T91 (i.e. a first discharging transistor) and a transistor T92 (i.e. a second discharging transistor). The gate (i.e. a first discharging control terminal) of the transistor T91 receives a first discharging control signal, for example the next-second-stage control signal FWD_CON(n+2) outputted from the next-second-stage shift register SR(n+2). The source (i.e. a second discharging conduction terminal) of the transistor T91 is electrically connected with the low reference voltage VSS. The drain (i.e. a first discharging conduction terminal) of the transistor T91 is electrically connected with the first node Q(n). The gate (i.e. a second discharging control terminal) of the transistor T92 receives a second discharging control signal, for example the next-third-stage control signal FWD_CON(n+3) outputted from the next-third-stage shift register SR(n+3). The source (i.e. a fourth discharging conduction terminal) of the transistor T92 is electrically connected with the low reference voltage VSS. The drain (i.e. a third discharging conduction terminal) of the transistor T92 is electrically connected with the first node Q(n).

Figure 3:
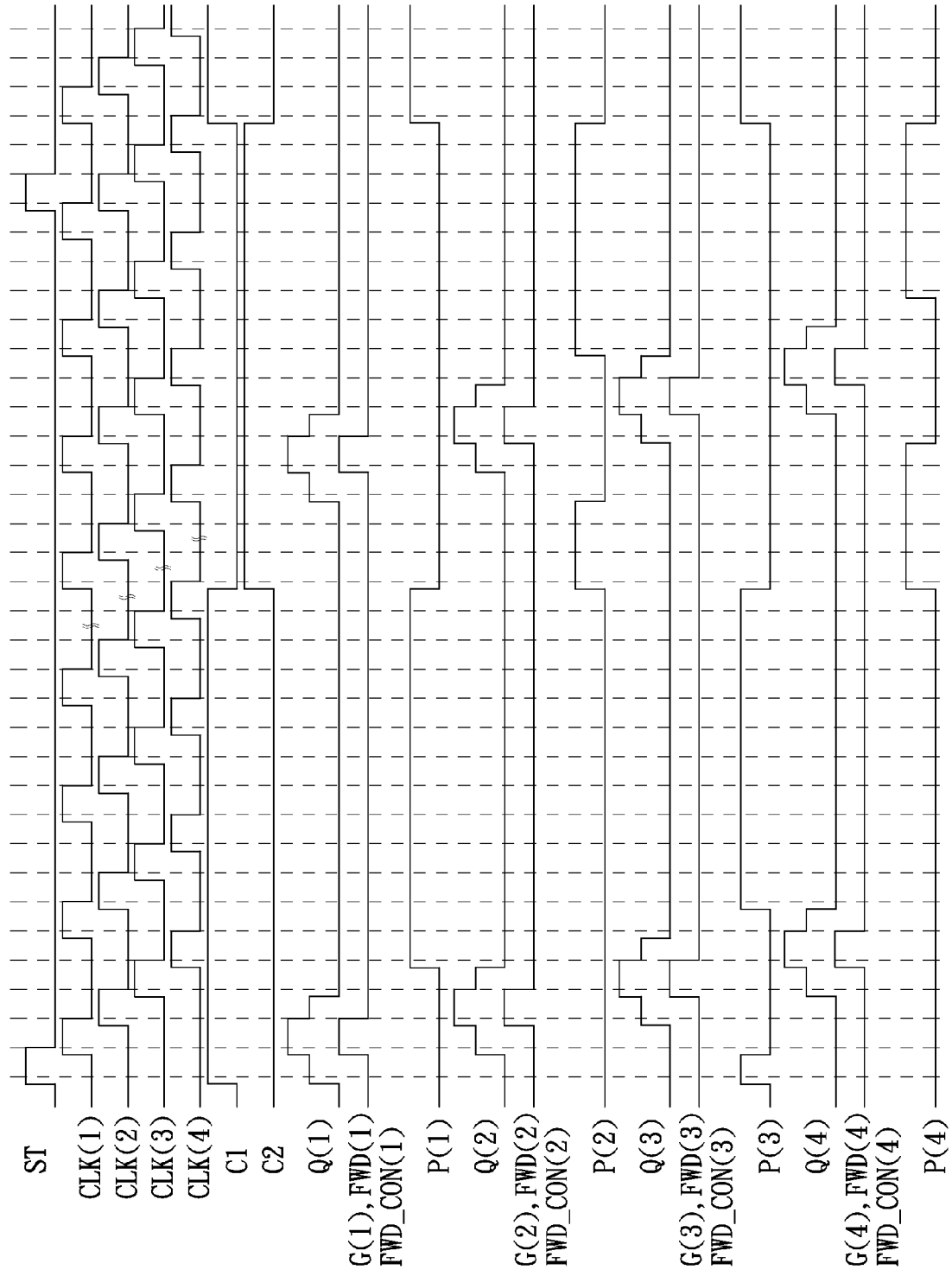
FIG. 3 is a schematic timing waveform diagram illustrated associated signals and voltage levels of associate nodes in the shift register of FIG. 2.

FIG. 3 is a schematic timing waveform diagram illustrated associated signals and voltage levels of associate nodes in the shift register of FIG. 2. Hereinafter, the operating principles of the shift register of the present invention will be illustrated in more details with reference to FIGS. 1, 2 and 3. For clarification, four clock-pulse signals CLK(1)~CLK(4) are shown in the drawing. It is noted that the number of clock-pulse signals are dependent on the pixel number of the liquid crystal display. That is, the number of clock-pulse signals used in the present invention may be varied according to the practical requirements. When a start signal ST is received by the liquid crystal display, the clock-pulse signals CLK(1)~CLK(4) are successively generated.

In this embodiment, the timing waveform diagram is illustrated by referring to the second-stage shift register SR(2). In a case that the previous-stage start pulse signal FWD(1) outputted from the previous-stage shift register SR(1) is at a high voltage-level state, the transistor T1 of the pull-up circuit 110 is conducted. Consequently, the previous-stage start pulse signal FWD(1) charges the first node Q(2), so that the voltage level of the first node Q(2) is pulled up. Meanwhile, the transistors T2, T3 and T4 are conducted. Since the clock-pulse signal CLK(2) of the second-stage shift register SR(2) is still at the low voltage-level state, the control signal FWD_CON(2) outputted from the control signal generator 120, the start pulse signal FWD(2) outputted from the first driving circuit 130 and the gate driving pulse signal G(2) outputted from the second driving circuit 140 are also at the low voltage-level state.

After the previous-stage start pulse signal FWD(1) outputted from the previous-stage shift register SR(1) is ended and lies at a low voltage-level state, the transistor T1 of the pull-up circuit 110 is shut off. Meanwhile, the first node Q(2) is in a floating condition, and the transistors T2, T3 and T4 are still conducted. Meanwhile, since the clock-pulse signal CLK(2) of the second-stage shift register SR(2) is at the high voltage-level state, the control signal FWD_CON(2) outputted from the control signal generator 120, the start pulse signal FWD(2) outputted from the first driving circuit 130 and the gate driving pulse signal G(2) outputted from the second driving circuit 140 are maintained at the high voltage-level state until the high voltage-level state of the clock-pulse signal CLK(2) is ended.

Moreover, since the control signal FWD_CON(2) outputted from the control signal generator 120, the start pulse signal FWD(2) outputted from the first driving circuit 130 and the gate driving pulse signal G(2) outputted from the second driving circuit 140 are at the high voltage-level state, a capacitive coupling effect will further pull up the voltage level of the first node Q(2). Until the high voltage-level state of the clock-pulse signal CLK(2) is ended, the voltage level of the first node Q(2) is reduced to the original amplitude.

Moreover, the first discharging circuit 191 is controlled according to the control signals FWD_CON(n) generated from a corresponding control signal generator 120. That is, the first discharging circuit 191 of the second-stage shift register SR(2) is controlled according to the control signals FWD_CON(4) and FWD_CON(5). Consequently, after the fourth-stage shift register SR(4) is enabled, the first discharging circuit 191 of the second-stage shift register SR(2) starts to discharge the first node Q(2).

Moreover, the voltage-stabilizing control unit 160 is controlled according to the voltage levels of the nodes Q(1) and Q(3), and the second reference signal C(2) is received by the voltage-stabilizing control unit 160. As such, when the second reference signal C(2) is at the high voltage-level state and the nodes Q(1) or Q(3) is at the high voltage-level state, the voltage-stabilizing control signal outputted from the output terminal P(2) of the voltage-stabilizing control unit 160 is at the low voltage-level state. Meanwhile, the first voltage-stabilizing unit 170 that is electrically connected with the output terminal P(2) of the voltage-stabilizing control unit 160 is disabled. Consequently, the operations of the control signal FWD_CON(2) outputted from the control signal generator 120, the start pulse signal FWD(2) outputted from the first driving circuit 130 and the gate driving pulse signal G(2) outputted from the second driving circuit 140 are not influenced.

In the shift register SR(n) of FIG. 3, the control signal FWD_CON(n) outputted from the control signal generator 120 and the gate driving pulse signal G(n) outputted from the second driving circuit 140 have the same waveform. It is noted that, in FIG. 3, the waveform of the gate driving pulse signal G(n) from the second driving circuit 140 is an ideal waveform. In practice, since the loading of the gate driving pulse signal G(n) from the second driving circuit 140 is relatively heavy to drive a great number of thin film transistors of a corresponding gate line of the liquid crystal display, the RC delay effect of the gate driving pulse signal G(n) from the second driving circuit 140 becomes more serious and the waveform thereof is seriously distorted.

However, since each stage of shift register of the shift register circuit of the present invention has an exclusive control signal generator 120 to generate a corresponding control signal, it is not necessary to drive heavy loading. In this situation, the waveform of the control signal FWD_CON(n) will no longer be seriously distorted. In practice, the waveform of the control signal FWD_CON(n) is near the ideal waveform as shown in FIG. 3. When the control signal is used as the control signal of some circuits of other stages of shift registers, the overall shift register circuit and the flat panel display can be normally operated.

Figure 4:
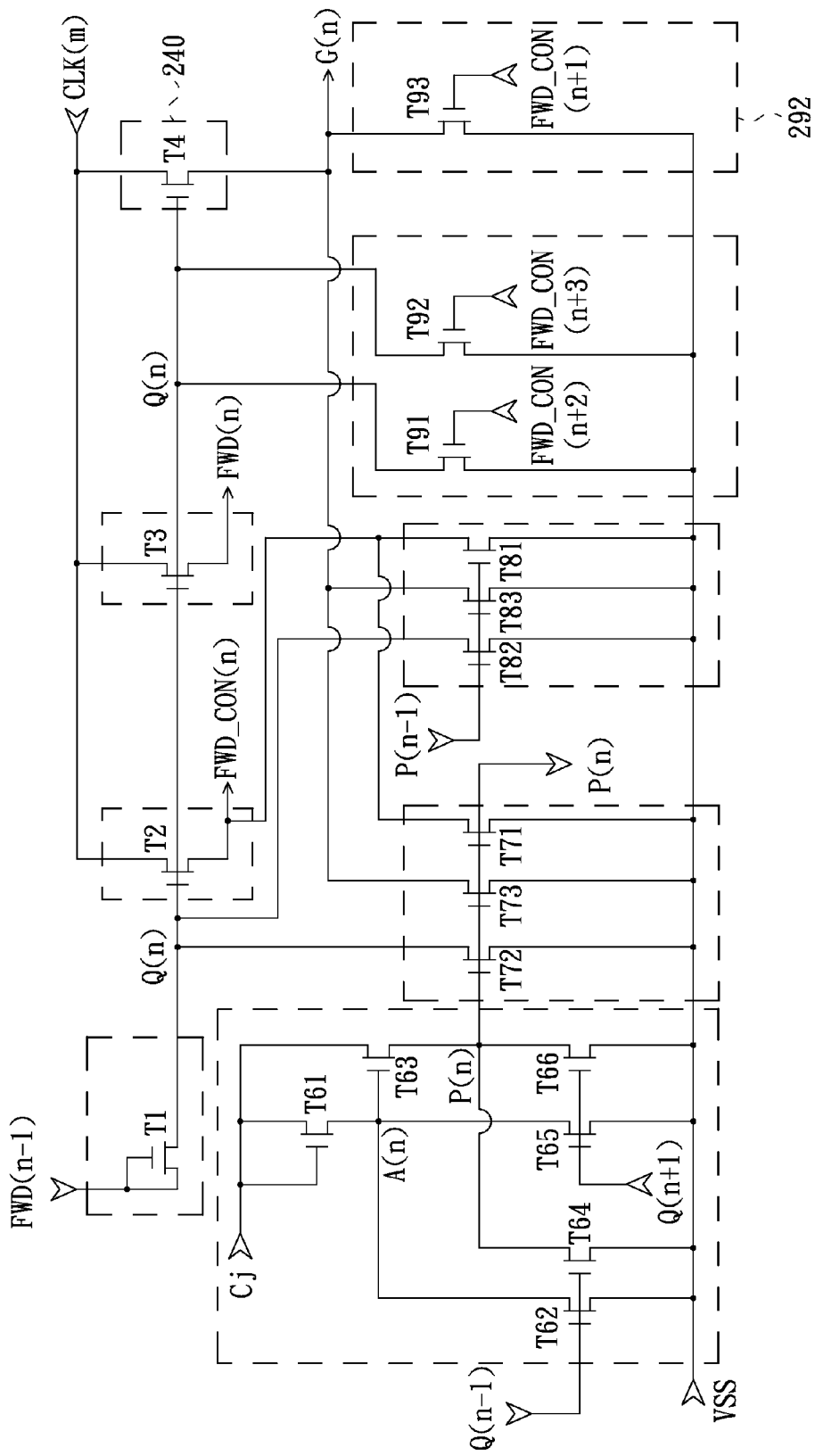
FIG. 4 is a schematic circuit diagram illustrating a shift register according to a second embodiment of the present invention.

FIG. 4 is a schematic circuit diagram illustrating a shift register according to a second embodiment of the present invention. Except that the shift register SR(n) of this embodiment further comprises a second discharging circuit 292, the configurations of the shift register SR(n) of this embodiment are substantially similar to those of FIG. 2. The second discharging circuit 292 is electrically connected between the output terminal of the second driving circuit 240 and the low reference voltage VSS. In addition, the second discharging circuit 292 receives a third discharging control signal, for example a next-stage control signal FWD_CON(n+1) outputted from the next-stage shift register SR(n+1).

In this embodiment, the second discharging circuit 292 comprises a transistor T93 (i.e. a third discharging transistor). The gate (i.e. a third discharging control terminal) of the transistor T93 receives a third control signal (i.e. the next-stage control signal FWD_CON(n+1)). The source (i.e. a sixth discharging conduction terminal) of the transistor T93 is electrically connected with the low reference voltage VSS. The drain (i.e. a fifth discharging conduction terminal) of the transistor T93 is electrically connected with the output terminal of the second driving circuit 240.

That is, in this embodiment, the second discharging circuit 292 of the shift register SR(n) may discharge the output terminal of the second driving circuit 240, thereby adjusting the waveform of the corresponding driving pulse signal G(n). Moreover, since the next-stage control signal FWD_CON(n+1) outputted from the next-stage shift register SR(n+1) is used as the control signal of the second discharging circuit 292, the reliability of the shift register circuit is enhanced.

Figure 5:
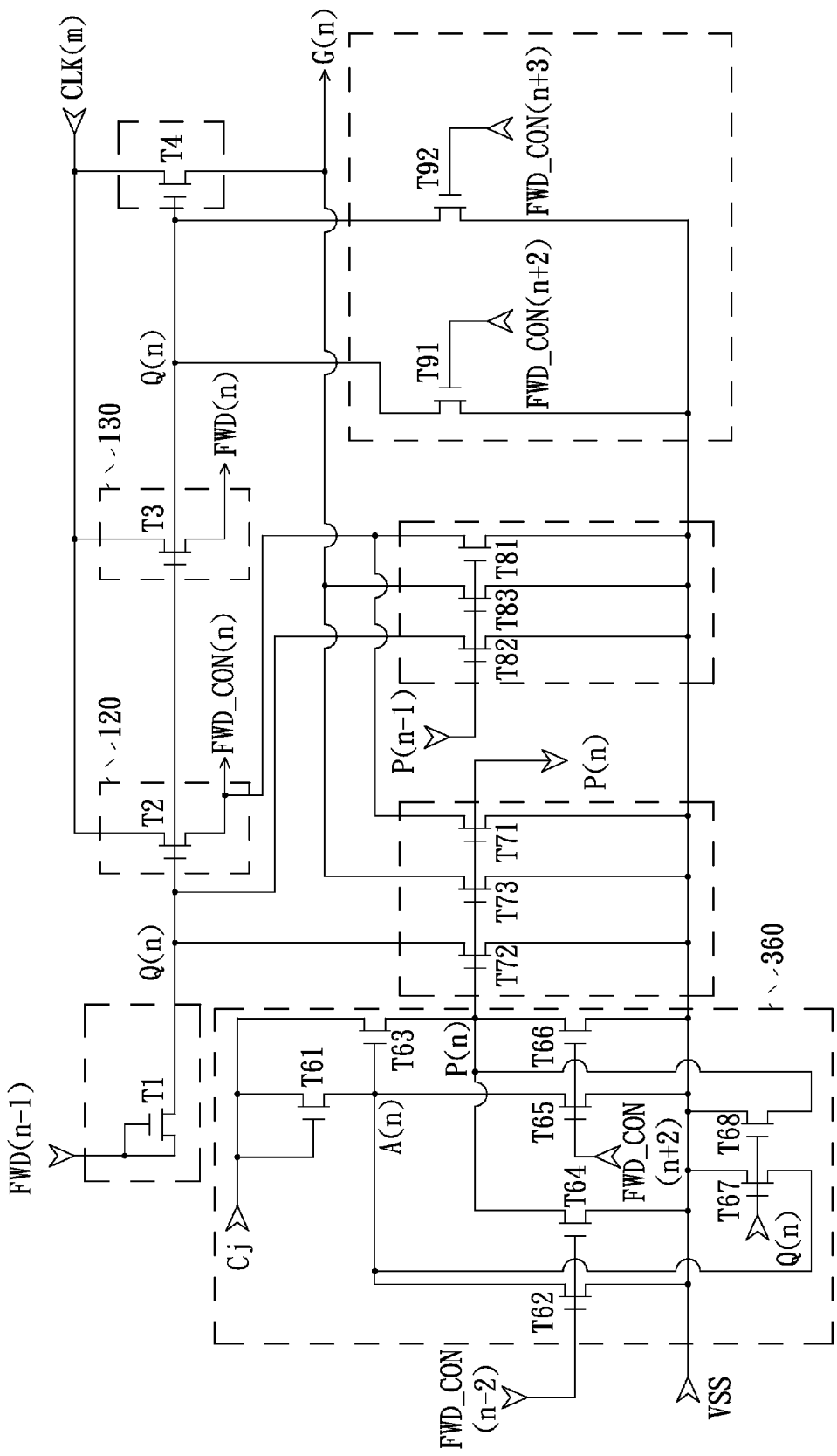
FIG. 5 is a schematic circuit diagram illustrating a shift register according to a third embodiment of the present invention.

FIG. 5 is a schematic circuit diagram illustrating a shift register according to a third embodiment of the present invention. Except that the voltage-stabilizing control unit 360 of the shift register SR(n) of this embodiment further comprises transistors T67 and T68, the configurations of the shift register SR(n) of this embodiment are substantially similar to those of FIG. 2. The gate of the transistor T67 receives the third control signal. The source of the transistor T67 is electrically connected with the low reference voltage VSS. The drain of the transistor T67 is electrically connected with the second node A(n). The gate of the transistor T68 also receives the third control signal. The source of the transistor T68 is electrically connected with the low reference voltage VSS. The drain of the transistor T68 is electrically connected with the output terminal P(n) of the voltage-stabilizing control unit 360.

In this embodiment, the first control signal is the previous-second-stage control signal FWD_CON(n−2) outputted from the previous-second-stage shift register SR(n−2); the second control signal is the next-second-stage control signal FWD_CON(n+2) outputted from the next-second-stage shift register SR(n+2); and the third control signal is the voltage level of the first node Q(n) of the current-stage shift register SR(n). That is, since the control signal FWD_CON(n) outputted from the control signal generator 320 is also used as the control signals of the voltage-stabilizing control units of other stages of shift registers, the reliability of the overall shift register circuit is enhanced.

Figure 6:
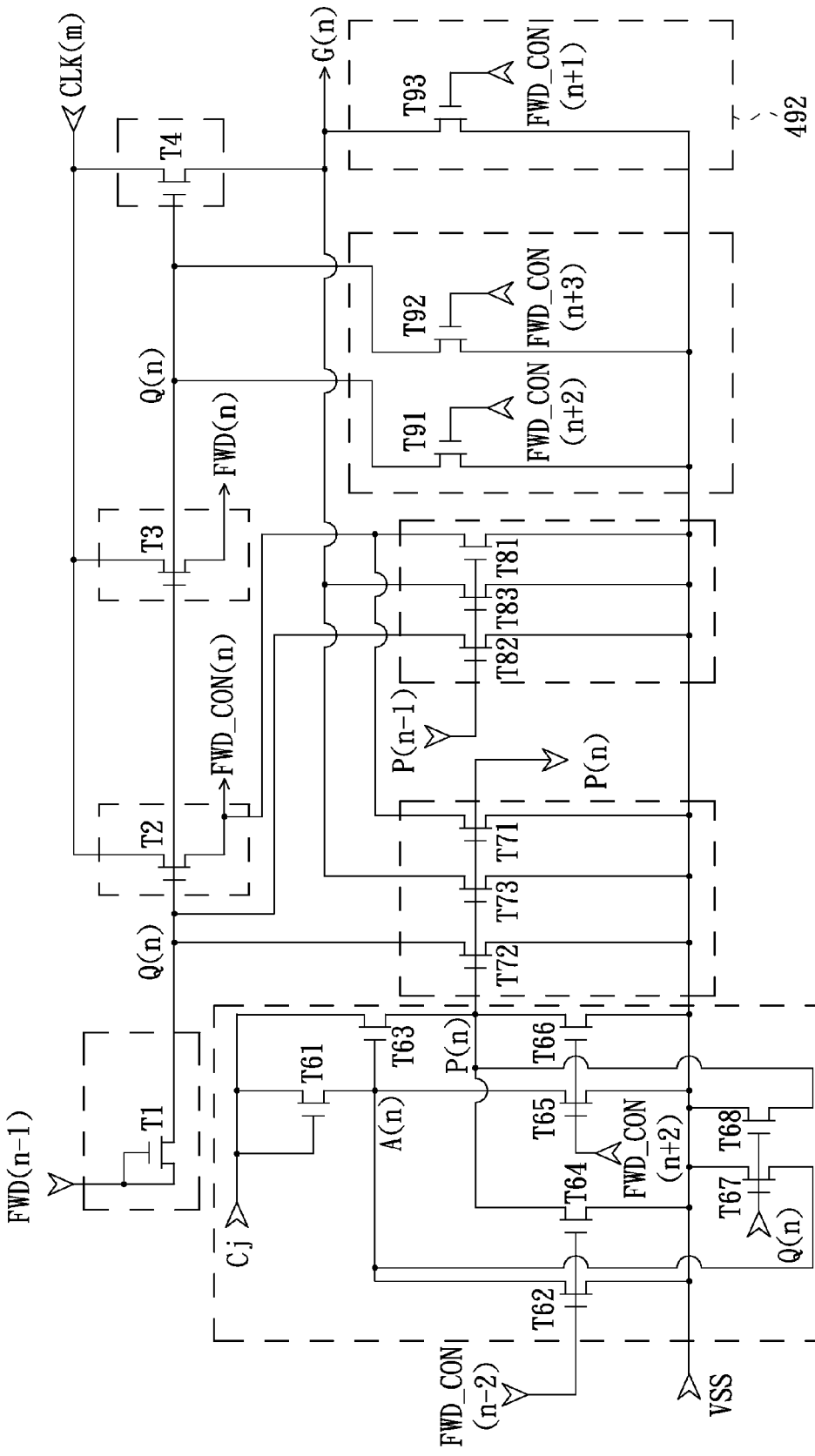
FIG. 6 is a schematic circuit diagram illustrating a shift register according to a fourth embodiment of the present invention.

FIG. 6 is a schematic circuit diagram illustrating a shift register according to a fourth embodiment of the present invention. Except that the shift register SR(n) of this embodiment further comprises a second discharging circuit 492 as shown in FIG. 4, the configurations of the shift register SR(n) of this embodiment are substantially similar to those of FIG. 5.

Figure 7:
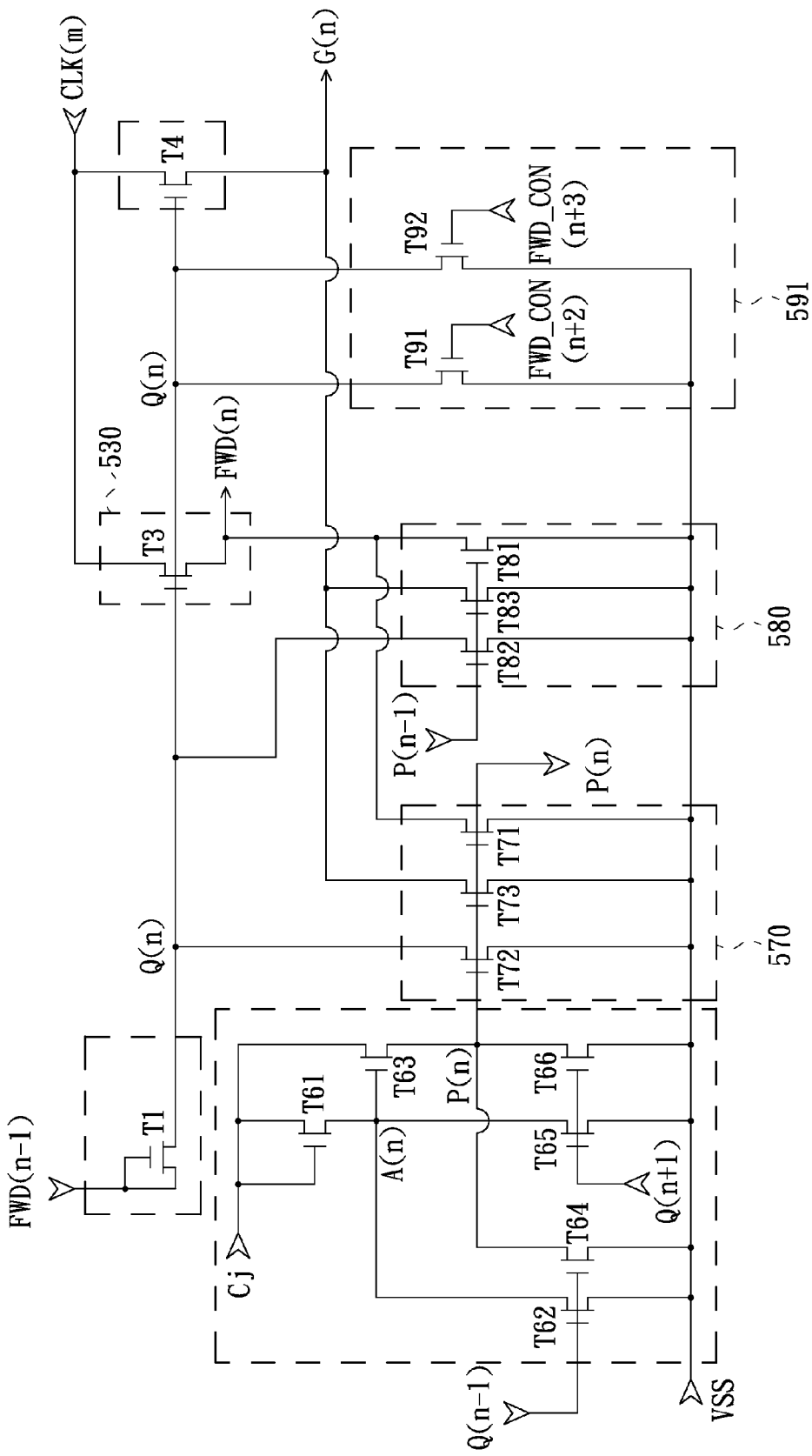
FIG. 7 is a schematic circuit diagram illustrating a shift register according to a fifth embodiment of the present invention.

FIG. 7 is a schematic circuit diagram illustrating a shift register according to a fifth embodiment of the present invention. Except that the start pulse signal FWD(n) outputted from the first driving circuit 530 of the shift register SR(n) is used as the control signal and the start pulse signal FWD(n) is stabilized by the transistor T71 of the first voltage-stabilizing unit 570 and the transistor T81 of the second voltage-stabilizing unit 580, the configurations of the shift register SR(n) of this embodiment are substantially similar to those of FIG. 2. That is, the control signal generator 120 of the shift register SR(n) of FIG. 2 is not included in the shift register SR(n) of this embodiment. In this embodiment, the start pulse signal FWD(n) outputted from the first driving signal 530 is used as the start pulse signal of the next-stage shift register SR(n+1) and also as the control signal of some circuits of other stages of shift registers. For example, the start pulse signals FWD (n+2) and FWD(n+3) outputted from the next-second shift register and the next-third shift register are used as the control signals of the first discharging circuit 591 of the current-stage shift register. Although no exclusive control signal generator 120 is contained in the shift register of this embodiment, since the start pulse signal FWD(n) outputted from the first driving signal 530 is only used as the start pulse signal of the next-stage shift register SR(n+1), the loading is not considerably increased. Since the start pulse signal FWD(n) outputted from the first driving signal 530 is used as the control signal, the problems of causing seriously distorted waveforms will be eliminated. Under this circumstance, the overall shift register circuit and the flat panel display can be normally operated.

From the above description, each stage of shift register of the shift register circuit has an exclusive control signal generator to generate a corresponding control signal, or the stabilized start pulse signal is used as the control signal. The control signal is only used as the control signal of some circuits of other stages of shift registers. Since it is not necessary to drive heavy loading, the problems of causing seriously distorted waveforms will be eliminated. Under this circumstance, the overall shift register circuit and the flat panel display can be normally operated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit comprising plural stages of shift registers, each stage of shift register comprising:
   a pull-up circuit for charging a first node;
   a control signal generator electrically connected with the first node, wherein according to a voltage level of the first node, a corresponding control signal is outputted from an output terminal of the control signal generator;
   a voltage-stabilizing circuit electrically connected with the output terminal of the control signal generator for stabilizing the control signal from the control signal generator, wherein some circuits of some other shift registers are controlled according to the control signal;
   a first driving circuit electrically connected with the first node, wherein according to the voltage level of the first node, a corresponding start pulse signal is outputted from an output terminal of the first driving circuit; and
   a second driving circuit electrically connected with the first node, wherein according to the voltage level of the first node, a corresponding driving pulse signal is outputted from an output terminal of the second driving circuit;
   wherein the voltage-stabilizing circuit comprises:
   a voltage-stabilizing control unit for generating a voltage-stabilizing control signal corresponding to a current-stage shift register;
   a first voltage-stabilizing unit electrically connected with the voltage-stabilizing control unit for receiving the voltage-stabilizing control signal, wherein according to the voltage-stabilizing control signal, the first voltage-stabilizing unit determines whether the output terminal of the control signal generator is discharged; and
   a second voltage-stabilizing unit for receiving a previous-stage voltage-stabilizing control signal from a previous voltage-stabilizing control unit of a previous-stage shift register, wherein according to the previous-stage voltage-stabilizing control signal, the second voltage-stabilizing unit determines whether the output terminal of the control signal generator is discharged;
   wherein the voltage-stabilizing control unit comprises:
   a first transistor having a first control terminal electrically connected with one of a first reference signal and a second reference signal, a first conduction terminal electrically connected with the first control terminal, and a second conduction terminal;
   a second transistor having a second control terminal receiving a first control signal, a third conduction terminal electrically connected with the second conduction terminal at a second node, and a fourth conduction terminal electrically connected with a low reference voltage;
   a third transistor having a third control terminal electrically connected with the second node, a fifth conduction terminal electrically connected with the first control terminal, and a sixth conduction terminal;
   a fourth transistor having a fourth control terminal receiving the first control signal, a seventh conduction terminal electrically connected with the sixth conduction terminal and used as an output terminal of the voltage-stabilizing control unit, and an eighth conduction terminal electrically connected with the low reference voltage;
   a fifth transistor having a fifth control terminal receiving a second control signal, a ninth conduction terminal electrically connected with the second node, and a tenth conduction terminal electrically connected with the low reference voltage; and
   a sixth transistor having a sixth control terminal receiving the second control signal, an eleventh conduction terminal electrically connected with the output terminal of the voltage-stabilizing control unit, and a twelfth conduction terminal electrically connected with the low reference voltage.

2. The shift register circuit according to claim 1, wherein the first voltage-stabilizing unit comprises a seventh transistor, which has a seventh control terminal electrically connected with the output terminal of the voltage-stabilizing control unit, a thirteenth conduction terminal electrically connected with the output terminal of the control signal generator, and a fourteenth conduction terminal electrically connected with the low reference voltage.

3. The shift register circuit according to claim 2, wherein the second voltage-stabilizing unit comprises an eighth transistor, which has an eighth control terminal receiving the previous-stage voltage-stabilizing control signal from the previous-stage shift register, a fifteenth conduction terminal electrically connected with the output terminal of the control signal generator, and a sixteenth conduction terminal electrically connected with the low reference voltage.

4. The shift register circuit according to claim 3, wherein the first voltage-stabilizing unit further comprises:
   a ninth transistor having a ninth control terminal electrically connected with the output terminal of the voltage-stabilizing control unit, a seventeenth conduction terminal electrically connected with the first node, and an eighteenth conduction terminal electrically connected with the low reference voltage; and a tenth transistor having a tenth control terminal electrically connected with the output terminal of the voltage-stabilizing control unit, a nineteenth conduction terminal electrically connected with the output terminal of the second driving circuit, and a twentieth conduction terminal electrically connected with the low reference voltage.

5. The shift register circuit according to claim 4, wherein the second voltage-stabilizing unit further comprises:

an eleventh transistor having an eleventh control terminal receiving the previous-stage voltage-stabilizing control signal, a twenty-first conduction terminal electrically connected with the first node, and a twenty-second conduction terminal electrically connected with the low reference voltage; and a twelfth transistor having a twelfth control terminal receiving the previous-stage voltage-stabilizing control signal, a twenty-third conduction terminal electrically connected with the output terminal of the second terminal, and a twenty-fourth conduction terminal electrically connected with the low reference voltage.

6. The shift register circuit according to claim 1, wherein the first control signal is a voltage level of a previous-stage first node of the previous-stage shift register, and the second control signal is a voltage level of a next-stage first node of a next-stage shift register.

7. The shift register circuit according to claim 1, wherein the voltage-stabilizing control unit further comprises:

a seventh transistor having a seventh control terminal receiving a third control signal, a thirteenth conduction terminal electrically connected with the second node, and a fourteenth conduction terminal electrically connected with the low reference voltage; and an eighth having an eighth control terminal receiving the third control signal, the fifteenth conduction terminal electrically connected with the output terminal of the voltage-stabilizing control unit, a sixteenth conduction terminal electrically connected with the low reference voltage.

8. The shift register circuit according to claim 7, wherein the first control signal is a previous-second-stage control signal outputted from a previous-second-stage shift register, the second control signal is a next-second-stage control signal outputted from a next-second-stage shift register, and the third control signal is a voltage level of the first node of the current-stage shift register.

9. The shift register circuit according to claim 1, wherein the first driving circuit comprises a first driving transistor, wherein the first driving transistor comprises a first driving control terminal electrically connected with the first node, a first driving conduction terminal receiving a corresponding clock-pulse signal, and a second driving control terminal used as the output terminal of the first driving circuit.

10. The shift register circuit according to claim 9, wherein the second driving circuit comprises a second driving transistor, wherein the second driving transistor comprises a second driving control terminal electrically connected with the first node, a third driving conduction terminal receiving the corresponding clock-pulse signal, and a fourth driving control terminal used as the output terminal of the second driving circuit.

11. The shift register circuit according to claim 10, wherein the control signal generator comprises a transistor, wherein the transistor has a control signal electrically connected with the first node, a first conduction terminal receiving the corresponding clock-pulse signal, a second conduction terminal used as the output terminal of the control signal generator.

12. The shift register circuit according to claim 1, wherein the pull-up circuit comprises a pull-up transistor, wherein the pull-up transistor comprises a control terminal receiving a previous-stage start pulse signal outputted from a previous-stage shift register, a first conduction terminal electrically connected with the control terminal, and a second conduction terminal electrically connected with the first node.

13. The shift register circuit according to claim 1, wherein the first driving circuit functions as the control signal generator, and corresponding start pulse signal outputted from the first driving circuit is used as a corresponding control signal.

14. A shift register circuit comprising plural stages of shift registers, each stage of shift register comprising:

a pull-up circuit for charging a first node;

a control signal generator electrically connected with the first node, wherein according to a voltage level of the first node, a corresponding control signal is outputted from an output terminal of the control signal generator;

a voltage-stabilizing circuit electrically connected with the output terminal of the control signal generator for stabilizing the control signal from the control signal generator, wherein some circuits of some other shift registers are controlled according to the control signal;

a first driving circuit electrically connected with the first node, wherein according to the voltage level of the first node, a corresponding start pulse signal is outputted from an output terminal of the first driving circuit;

a second driving circuit electrically connected with the first node, wherein according to the voltage level of the first node, a corresponding driving pulse signal is outputted from an output terminal of the second driving circuit; and a first discharging circuit electrically connected between the first node and a low reference voltage for discharging the first node;

wherein the first discharging circuit comprises:

a first discharging transistor having a first discharging control terminal receiving a first discharging control signal, a first discharging conduction terminal electrically connected with the first node, and a second discharging conduction terminal electrically connected with the low reference voltage; and a second discharging transistor having a second discharging control terminal receiving a second discharging control signal, a third discharging conduction terminal electrically connected with the first node, and a fourth discharging conduction terminal electrically connected with the low reference voltage, wherein the first discharging control signal is a next-second-stage control signal outputted from a next-second-stage shift register, and the second discharging control signal is a next-third-stage control signal outputted from a next-third-stage shift register;

wherein the voltage-stabilizing circuit comprises:

a voltage-stabilizing control unit for generating a voltage-stabilizing control signal corresponding to a current-stage shift register;

a first voltage-stabilizing unit electrically connected with the voltage-stabilizing control unit for receiving the voltage-stabilizing control signal, wherein according to the voltage-stabilizing control signal, the first voltage-stabilizing unit determines whether the output terminal of the control signal generator is discharged; and a second voltage-stabilizing unit for receiving a previous-stage voltage-stabilizing control signal from a previous voltage-stabilizing control unit of a previous-stage shift register, wherein according to the previous-stage voltage-stabilizing control signal, the second voltage-stabilizing unit determines whether the output terminal of the control signal generator is discharged.

15. The shift register circuit according to claim 14, wherein each stage of shift register further comprises a second discharging circuit, wherein the second discharging circuit comprises a third discharging transistor, and the third discharging transistor has a third discharging control terminal receiving a third discharging control signal, a fifth discharging conduction terminal electrically connected with the output terminal of the second driving circuit, and a sixth discharging conduction terminal electrically connected with the low reference voltage, wherein the first discharging control signal is a next-stage control signal outputted from a next-stage shift register.

* * * * *